(12) United States Patent
Okuaki

(10) Patent No.: US 6,445,018 B1
(45) Date of Patent: Sep. 3, 2002

(54) SEMICONDUCTOR DEVICE HAVING SIGNAL LINE ABOVE MAIN GROUND OR MAIN VDD LINE, AND MANUFACTURING METHOD THEREOF

(75) Inventor: Katsumi Okuaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/569,945

(22) Filed: May 12, 2000

(30) Foreign Application Priority Data

May 17, 1999 (JP) .......................................... 11-136371

(51) Int. Cl.[7] .......................... H01L 27/10; H01L 23/48
(52) U.S. Cl. ........................ 257/211; 257/207; 257/208; 257/758; 438/128; 438/129
(58) Field of Search ................................. 257/758, 208, 257/211, 207, 401, 691; 438/128, 129; 327/210, 435

(56) References Cited

U.S. PATENT DOCUMENTS 5,949,098 A * 9/1999 Mori ........................... 257/211
6,166,403 A * 12/2000 Castagnetti et al. ........ 257/211

* cited by examiner

Primary Examiner—Tom Thomas
Assistant Examiner—Donghee Kang
(74) Attorney, Agent, or Firm—Michael Best & Friedrich LLC; J. Warren Whitesel

(57) ABSTRACT

A semiconductor device is disclosed, by which the parasitic capacitance of each signal line can be decreased, the time necessary for developing the device can be decreased, and which has a structure for simply and quickly performing the characteristic evaluation of the semiconductor device. The semiconductor device comprises a lower-layer signal line provided below one of a main power-supply line and a main ground line via an insulating layer; and an upper-layer signal line provided above said one of the main power-supply line and the main ground line via an insulating layer. A window is formed in said one of the main power-supply line and the main ground line; and the lower-layer signal line and the upper-layer signal line are electrically connected in a space inside the window, without contacting said one of the main power-supply line and the main ground line.

7 Claims, 6 Drawing Sheets

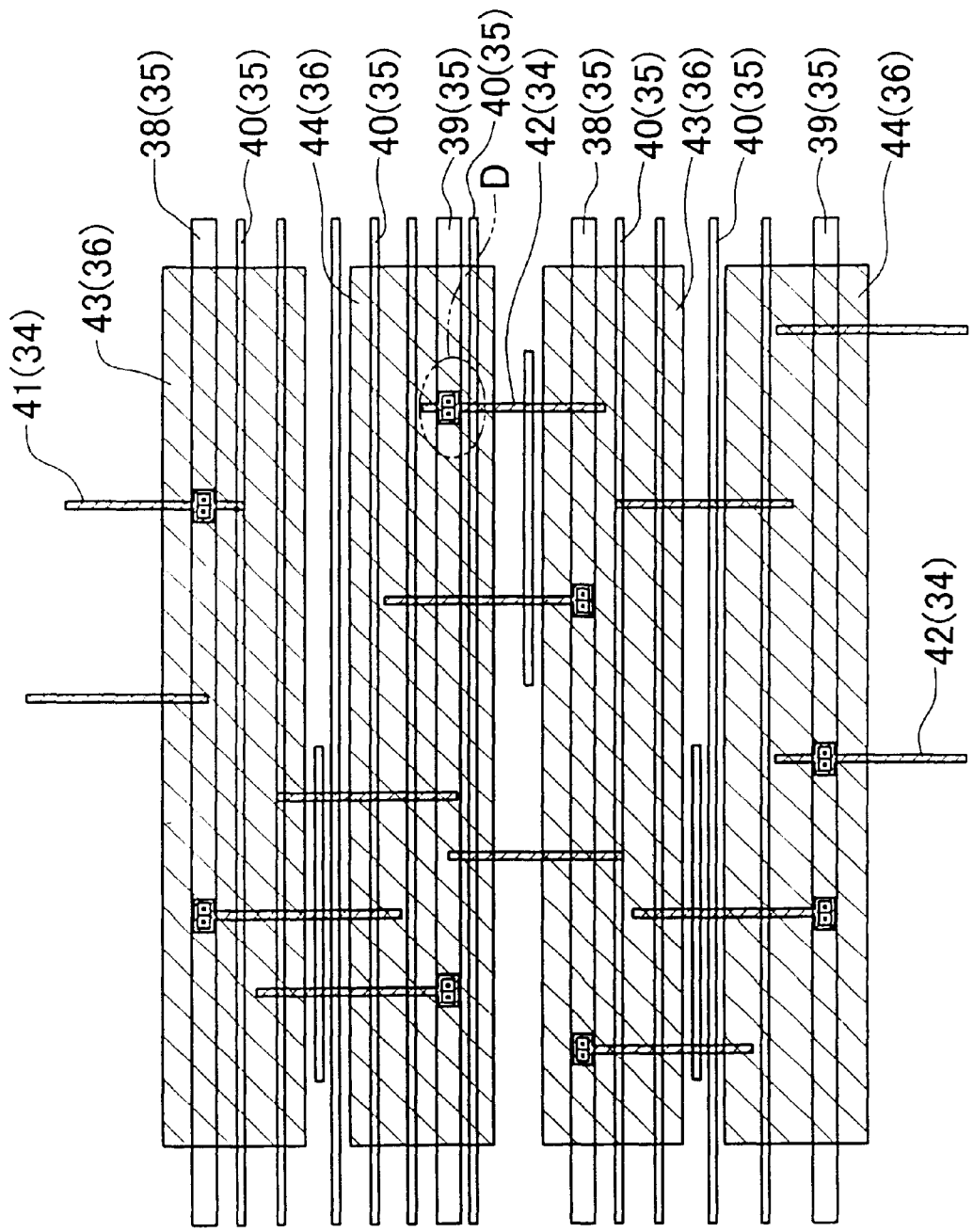

SEMICONDUCTOR DEVICE HAVING SIGNAL LINE ABOVE MAIN GROUND OR MAIN VDD LINE, AND MANUFACTURING METHOD THEREOF

BACKGROUND OF THE INVENTION

1. Field of the Invention

The present invention relates to a semiconductor device and a method of manufacturing thereof, in particular, to a multi-layered wiring structure including main power-supply lines, main ground (or grounding) lines, signal lines, and the like.

2. Description of the Related Art

Recently, in the technical field of semiconductor devices, DRAM/logic mixed LSIs have become the focus of attention. Each DRAM/logic mixed LSI provides DRAM functions and logic functions on a single chip. FIG. 9 is a diagram showing the structure of an example of the DRAM/logic mixed LSI. As shown in the figure, in the DRAM/logic mixed LSI, DRAM area 31 and logic circuit area 32 are provided on a single chip 30. In addition, a plurality of pads 33 are arranged in a peripheral area of the chip. FIG. 5 is a partially-enlarged view of the DRAM area 31.

In the following explanation, the "mask block" corresponds to an area in which a circuit is formed, and a plurality of mask blocks form a "mask block shelf". Additionally, in FIG. 5, each reference numeral in the brackets indicates a specific kind of wiring.

In FIG. 5, transistors, capacitors, and the like, arranged in lower layers, are not shown in the DRAM area 31, and only wiring lines are shown. In this area, a three-layered aluminum (Al) wiring structure is employed, which includes (i) first AL wiring lines 34 (see finely shaded lines) vertically arranged in FIG. 5, (ii) second AL wiring lines 35 horizontally arranged in FIG. 5, and (iii) third AL wiring lines 36 (see roughly shaded lines) horizontally arranged in FIG. 5. In the present specification, the first AL wiring lines indicate the AL wiring lines formed in the first layer from the bottom of the three-layered AL wiring structure, the second AL wiring lines indicate the AL wiring lines formed in the second layer from the bottom of the three-layered AL wiring structure, and the third AL wiring lines indicate the AL wiring lines formed in the third layer from the bottom of the three-layered AL wiring structure.

In the illustrated DRAM/logic mixed LSI, each first AL wiring line 34 is used as (i) a line for vertically connecting a P-channel transistor and an N-channel transistor in a mask block, (ii) a power-supply line (called a "VDD line", hereinafter) 41 or a ground (or grounding or earth) line (called a "GND line", hereinafter) 42 in a mask block, (iii) a signal line for connecting vertically adjacent mask block shelves, or the like.

Each second AL wiring line 35 is used as a VDD line 38 or a GND line 39 in a mask block shelf, a wide area signal line (called a "bus line", hereinafter) 40, or the like.

Each third AL wiring line 36 is used as a main VDD line 43 or a main GND line 44 which has a larger width and which is used in common between mask block shelves, or the like. Generally, in conventional DRAMs, the main VDD lines, main GND lines, and the like are formed using the second AL wiring lines. However, in the DRAM/logic mixed LSI, the above-explained structure is often employed as required by the design of relevant logic circuits.

FIG. 6 is an enlarged view of an area (see the circled area indicated by reference symbol D in FIG. 5) where the first AL wiring line 34, the second AL wiring line 35, and the third AL wiring line 36 are connected so as to provide a GND line arrangement. FIG. 7 is a cross-sectional view along line B—B in FIG. 6. As shown in FIG. 6, enlarged portion 42a (enlarged in the width direction) is formed in the GND line 42 formed by the first AL wiring line 34, and first through holes 45 and second through holes 46, having the same diameter (or width), are formed in a manner such that they are vertically aligned. Between the first through holes 45 and the second through holes 46, a GND line 39 formed by the second AL wiring line 35 is provided, and a main GND line 44 formed by the third AL wiring line 36 is provided above the second through holes 46.

FIG. 7 is a cross-sectional view of the above area shown in FIG. 6, and FIG. 7 also shows a portion including a transistor. As shown in FIG. 7, transistor 50 is formed on silicon substrate 47, which comprises a gate electrode 48, and $N^+$ diffusion layers 49a and 49b functioning as source and drain electrodes. The first AL wiring lines 34 formed on the first inter-layer insulating film 51 are respectively connected to $N^+$ diffusion layers 49a and 49b via the first contacts 52. On one of the GND lines 42 formed by the first AL wiring line, the fist through holes 45, passing through the second inter-layer insulating film 53, are formed. The GND line 42 formed by the first AL wiring line 34 and the GND line 39 formed by the second AL wiring line 35 are connected via the first conductors 55 in the first through holes 45.

In addition, above the GND line 39 formed by the second AL wiring line 35, the second through holes 46 are formed, which pass through the third inter-layer insulating film 56. The GND line 39 formed by the second AL wiring line 35 and the main GND line 44 formed by the third AL wiring line 36 are connected via the second conductors 58 in the second through holes 46. Therefore, the earth voltage of the main GND line 44 formed by the third AL wiring line 36 is supplied via the GND line 39 formed by the second AL wiring line 35 to the GND line 42 formed by the first AL wiring line 34. Here, the arrangement including the VDD lines is not shown, but has a similar structure.

The conventional DRAM/logic mixed LSI having the above-explained structure has the following problems.

FIG. 7 shows the portion where the first, second, and third AL wiring lines are connected so as to provide a GND line arrangement, while FIG. 8 shows a sectional view (along line E—E in FIG. 6) showing a portion where the bus line 40 are provided. In the DRAM/logic mixed LSI, the bus line 40 is formed by the second AL wiring line 35, and the main GND line 44 is formed by the third AL wiring line 36. Therefore, as shown in FIG. 8, the main GND line 44 having a larger width is positioned above the bus line 40, while below the bus line 40, the first AL wiring line 34 is positioned. Accordingly, the bus line is positioned between the first and third AL wiring lines via each inter-layer insulating film; thus, capacity (or capacitance) is generated at either side of the bus line, thereby increasing the parasitic capacitance of the bus line.

Depending on the increase of the parasitic capacitance of the bus line, the delay of the signal passing through the relevant bus line is also increased, so that the timing between the above signal and the other signals becomes out of order, which may cause various kinds of operational errors. Therefore, in order to adjust the signal timing between a plurality of bus lines, lines for adjusting the wiring capacity are provided in advance, the mask pattern is changed according to need, and the line for adjusting the wiring capacity is connected to any bus line, so that the wiring capacity is adjusted between the bus lines. In the above DRAM/logic mixed LSI, such lines for adjusting the wiring capacity are formed in advance by using the second AL wiring line, that is, formed in the same layer as that of each bus line, and the formed lines function as AL master slice signal lines used for changing the pattern.

In the design and experimental manufacture of a device, it is important to quickly complete the debugging process of the characteristics of the product. However, in the above DRAM/logic mixed LSI, the AL master slice signal lines for changing the pattern are formed in the second layer of the three-layer wiring structure; thus, the mask pattern in the second AL wiring lines is changed, and after the relevant mask is formed, the manufacturing processes (carried out on the wafer) before the patterning of the second AL wiring lines are started again. Therefore, the time necessary for completing the processes from the change of the mask pattern to the completion of the product is relatively long, thereby causing a delay in the development of the device.

On the other hand, when the timing disorder between the signals of a plurality of bus lines is evaluated, or other various characteristics are evaluated, it is the simplest and quickest method to perform the characteristic measurement by bringing the probe of a tester into direct contact with the AL wiring line of the target bus line in the wafer. However, the main GND line having a larger width formed by the third AL wiring line is positioned above the second AL wiring line; thus, the main GND line is an obstacle, that makes the direct contact of the probe with the bus line impossible. In this case, a hole may be provided through the main GND line, insulating film, and the like positioned above the bus line, by using an FIB (focused ion beam) or the like, so as to probe the bus line. However, in this method, the time and labor necessary for evaluating the characteristics are very large.

SUMMARY OF THE INVENTION

In order to solve the above problems, an objective of the present invention is to provide a semiconductor device and a manufacturing method thereof, by which the parasitic capacitance of each signal line can be decreased and the time necessary for developing the device can also be decreased. Another objective of the present invention is to provide a semiconductor device having a structure by which the characteristic evaluation of the semiconductor device can be simply and quickly performed.

Therefore, the present invention provides a semiconductor device comprising:

a lower-layer signal line provided below one of a main power-supply line and a main ground line via an insulating layer; and an upper-layer signal line provided above said one of the main power-supply line and the main ground line via an insulating layer, wherein:

a window is formed in said one of the main power-supply line and the main ground line; and the lower-layer signal line and the upper-layer signal line are electrically connected in a space inside the window, without contacting said one of the main power-supply line and the main ground line.

Preferably, the upper-layer signal line is formed by the uppermost layer of a multi-layered structure.

In the conventional wiring-arrangement technique explained above, if (i) a signal line (i.e., bus line) is present in an intermediate layer of a multi-layered wiring structure, (ii) a main GND or VDD line having a wider width is positioned in an upper layer of the multi-layered wiring structure, and (iii) another signal line is positioned in a lower layer of the multi-layered wiring structure, the parasitic capacitance of the signal line of the intermediate layer is large because the signal line is positioned between the upper and lower wiring lines. In contrast, in the semiconductor device according to the present invention, the positional relationship between the main GND or VDD line and the upper-layer signal line is reversed in comparison with the conventional case. That is, in the semiconductor device of the present invention, the main GND or VDD line having a wider width is formed in an intermediate layer, and a relevant signal line is present at the upper side thereof. Therefore, as for this signal line, the capacitance is generated only at the lower side of the signal line, thereby decreasing the parasitic capacitance of the signal line in comparison with the conventional case.

Also in the structure according to the present invention, the main GND or VDD line having a wider width is not an obstacle for measuring the characteristics, that is, the characteristic measurement can be performed by bringing the probe of a tester into direct contact with the exposed upper-layer signal line before another film, such as a passivation film, is formed on the upper-layer signal line. Therefore, the process of opening a hole using an FIB or the like (which is necessary in the conventional case) is unnecessary. Accordingly, the time and labor necessary for measuring the characteristics of the device can be decreased.

In particular, if the upper-layer signal line is formed by the uppermost layer of a multi-layered structure, it is further preferable that a wiring line for adjusting the wiring capacity of the upper-layer signal line be formed by the same wiring layer as that for forming the upper-layer signal line, that is, by the uppermost layer. In this case, when the wiring capacitance of the signal line is adjusted, the target layer whose mask pattern must be modified is the uppermost wiring layer; thus, the necessary processes from the modification of the mask pattern to the completion of the relevant product are fewer. Therefore, time necessary for debugging of the characteristics of the product can also be shorter, thereby shortening the schedule for developing the device.

More specifically, it is possible that the lower-layer signal line is formed by the nth wiring layer, where n is a natural number of 1 or more; said one of the main power-supply line and the main ground line is formed by the (n+1)th wiring layer; and the upper-layer signal line its formed by the (n+2)th wiring layer. For example, the lower-layer signal line may be formed by the first AL (aluminum) wiring line, the main VDD or GND line may be formed by the second AL wiring line, and the upper-layer signal line may be formed by the third AL wiring line. However, the arrangement according to the present invention is not limited to the above structure if the positional relationship between each wiring line has the order (from the bottom side) of the lower-layer signal line→the main VDD or GND line→the upper-layer signal line.

As for the electric connection between the lower-layer signal line and the upper-layer signal line in the space inside the window, the lower-layer signal line formed by the first AL wiring line may be connected with the upper-layer signal line formed by the third AL wiring line via a through hole which passes through insulating films of different layers, but a process for realizing such a structure is very difficult. Therefore, in a preferable example of connecting these signal lines, a conducting portion is provided in a space inside the window in a manner such that the conducting portion is isolated from said one of the main power-supply line and the main ground line; and the lower-layer signal line and the conducting portion are connected via a through hole, and the conducting portion and the upper-layer signal line are connected via a through hole.

More preferably, a plurality of the through holes are provided at either side of the conducting portion. In this case, even if the contact state of one of the two through holes becomes defective, conduction between the upper-layer signal line and the lower-layer signal line does not become defective if the other through hole is normal. Therefore, the reliability of wiring and the yield on products can be improved.

In addition, the upper-layer signal line may be used as a wide area signal line (i.e., bus line).

The present invention also provides a method of manufacturing a semiconductor device, comprising the processes of:

forming a lower-layer signal line on a semiconductor substrate via a first insulating film;

forming a second insulating film with which the lower-layer signal line is covered;

forming a first through hole which passes through the second insulating film and reaches the lower-layer signal line;

embedding a first conductor in the first through hole;

forming one of a main power-supply line and a main ground line on the second insulating film, which has a window for providing a space above the first conductor, and forming a conducting portion on the first conductor inside the window, where the conducting portion is isolated from said one of the main power-supply line and the main ground line;

forming a third insulating film with which the conducting portion and said one of the main power-supply line and the main ground line are covered;

forming a second through hole which passes through the third insulating film and reaches the conducting portion;

embedding a second conductor in the second through hole; and forming an upper-layer signal line on the second conductor.

According to this method, the semiconductor device (of the present invention) having the above-explained effects can be manufactured without using a special manufacturing process. In addition, after the upper-layer signal line is formed, a characteristic measurement can be performed by bringing a probe of a tester into direct contact with the exposed upper-layer signal line.

BRIEF DESCRIPTION OF THE DRAWINGS

FIG. 5 is a plan view showing a portion of the DRAM area of a conventional DRAM/logic mixed LSI.

DESCRIPTION OF THE PREFERRED EMBODIMENTS

Figure 1:
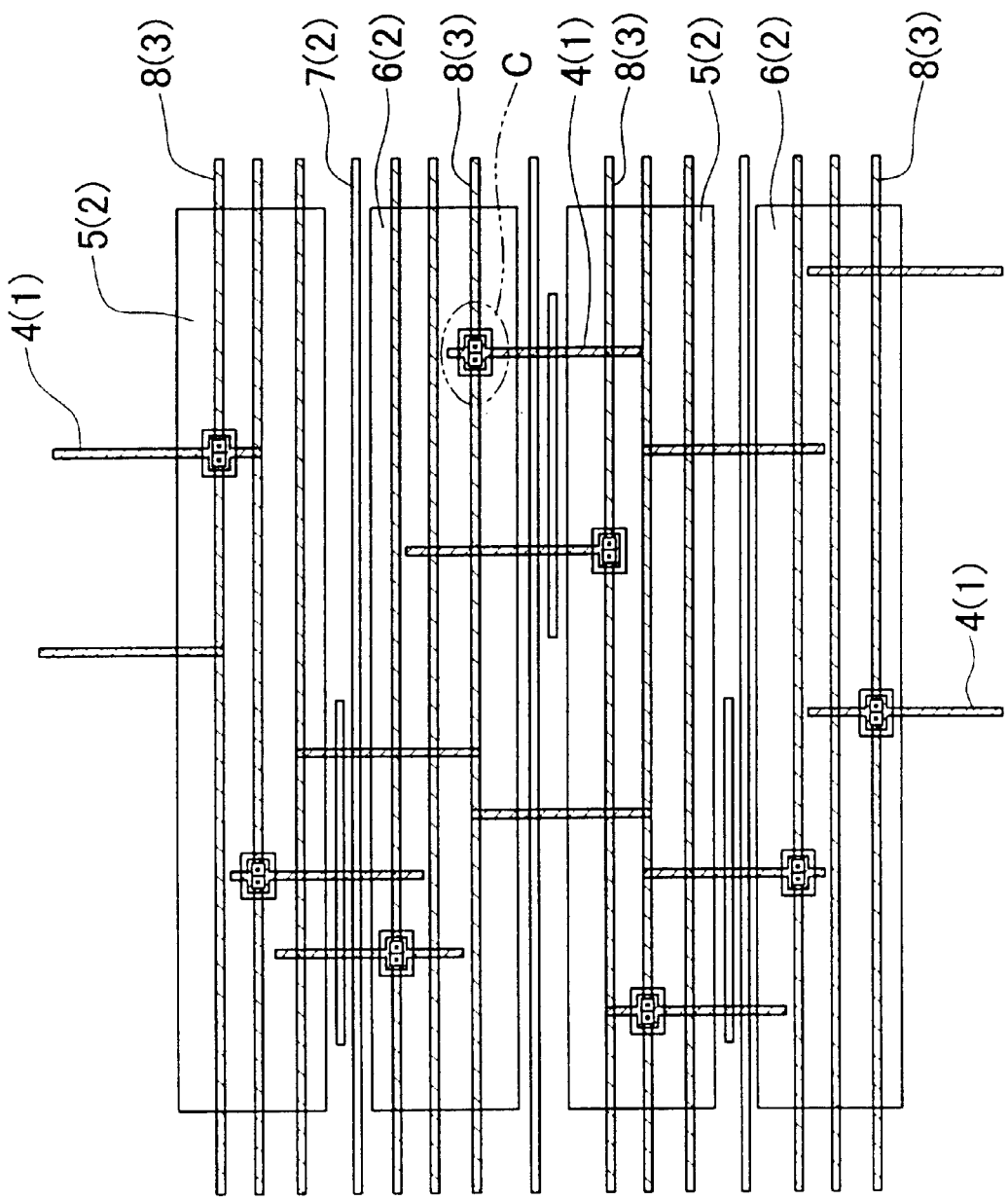
FIG. 1 is a plan view showing a portion of the DRAM area of the DRAM/logic mixed LSI as an embodiment.
Figure 2:
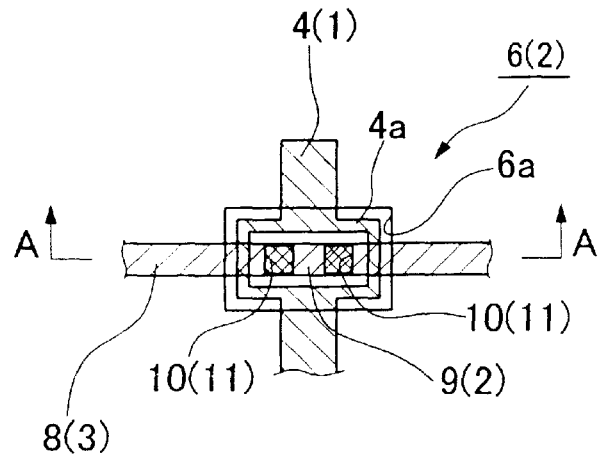
FIG. 2 is an enlarged view of a portion where a signal line and a bus line in the DRAM area are connected.
Figure 3:
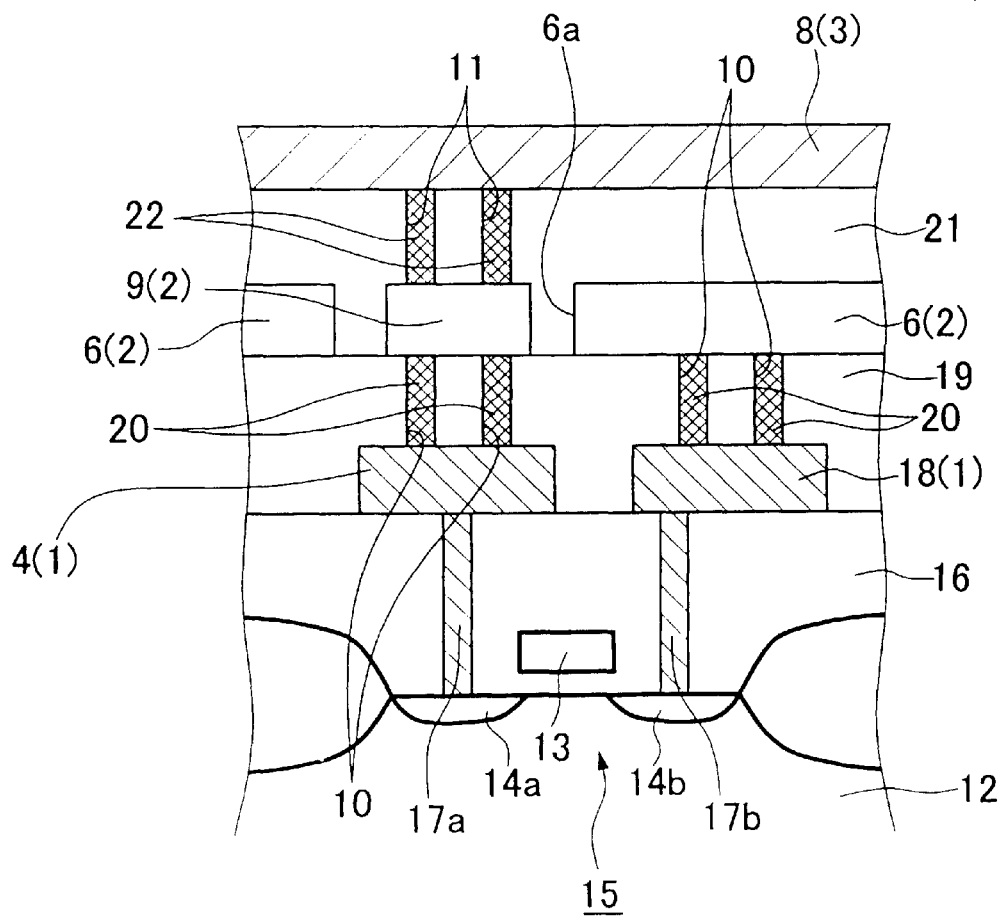
FIG. 3 is a cross-sectional view along line A—A in FIG. 2.

Hereinafter, an embodiment according to the present invention will be explained with reference to. FIGS. 1 to 3.

FIGS. 1 to 3 are diagrams showing the structure of the DRAM/logic mixed LSI (i.e., semiconductor device). FIG. 1 shows a portion of the DRAM area, FIG. 2 is an enlarged view of a portion where a signal line and a bus line in FIG. 1 are connected, and FIG. 3 is a cross-sectional view along line A—A in FIG. 2. In the present embodiment, the present invention is applied to the DRAM/logic mixed LSI, where the wiring arrangement that is the distinctive feature of the present invention is applied to the DRAM area. Therefore, explanations for the logic circuit area are omitted.

Figure 9:
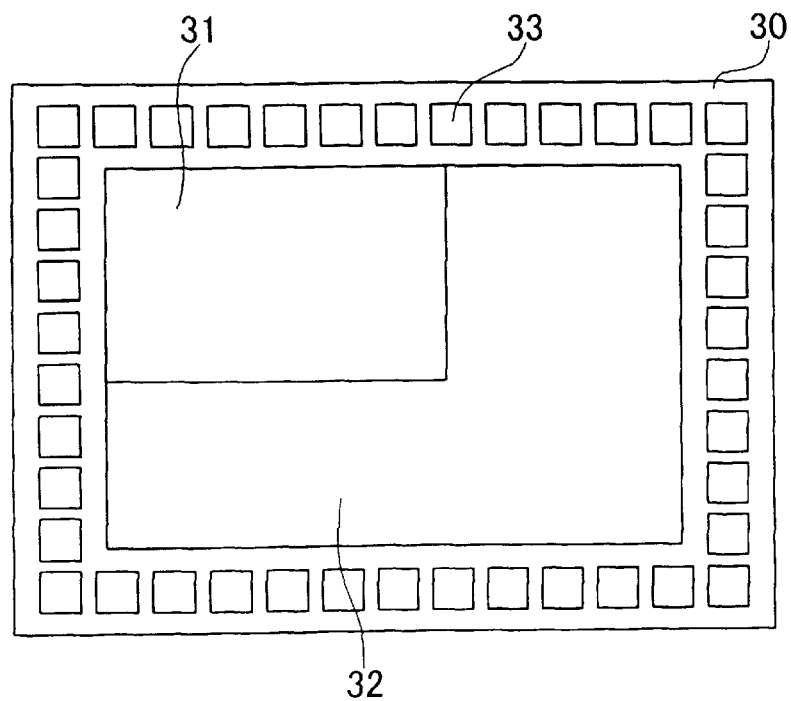
FIG. 9 is a diagram showing the general structure of an example of the DRAM/logic mixed LSI.

FIG. 1 shows only wiring lines included DRAM area 31 of the DRAM/logic mixed device as shown in FIG. 9, that is, transistors, capacitors, and the like provided in lower layers are omitted in the figure. Like the device explained in the Description of the Related Art, the wiring arrangement of the present embodiment also employs a three-layered aluminum (Al) wiring structure (in FIG. 1, reference numerals in the brackets indicate the kinds of the wiring lines), which includes (i) first AL wiring lines 1 (see finely shaded lines, which are positioned in the "nth" wiring layer) vertically arranged in FIG. 5, (ii) second AL wiring lines 2 horizontally arranged in FIG. 1 (positioned in the (n+1)th wiring layer), and (iii) third AL wiring lines 3 (see roughly shaded lines, which are positioned in the (n+2)th wiring layer) horizontally arranged in FIG. 1.

In the DRAM/logic mixed LSI of the present embodiment, each first AL wiring line 1 is used as (i) a line for vertically connecting a P-channel transistor and an N-channel transistor in a mask block, (ii) a VDD line or a GND line in a mask block, (iii) a signal line 4 for connecting vertically-adjacent mask block shelves, or the like.

Each second AL wiring line 2 is used as (i) a main VDD line 5 passing through P-channel areas which are stacked and face each other between the mask blocks, (ii) a main GND line 6 passing through N-channel areas which are stacked and face each other between the mask blocks, (iii) a signal line 7 between adjacent mask blocks, or the like.

Each third AL wiring line 3 is used as a bus line 8, a line for adjusting the capacity (not shown) functioning as an AL master slice signal line.

FIG. 2 is an enlarged view of the circled portion as indicated by reference symbol C in FIG. 1, where the signal line (i.e., the lower-layer signal line) 4 formed by the first AL wiring line 1 and the bus line (i.e., the upper-layer signal line) 8 formed by the third AL wiring line are connected. As shown in FIG. 2, enlarged portion 4a (which is enlarged in the width direction) is formed in the signal line 4 formed by the first AL wiring line 1 which is vertically arranged, and a window 6a of the main GND line 6 (formed by the second AL wiring line 2) is provided around the enlarged portion 4a. In the area of the enlarged portion 4a in FIG. 2, conducting portion 9 formed by the second AL wiring line 2 is provided, and first through holes 10 and second through holes 11 having the same diameter (or width) are provided above and below the conducting portion 9, in a manner such that the through holes 10 and second through holes 11 are vertically aligned. In addition, bus line 8 formed by the third AL wiring line 3 is horizontally formed above the conducting portion 9. Both the main GND line 6 and conducting portion 9 are formed by the second AL wiring line 2, but the conducting portion 9 is positioned and isolated inside the window 6a of the main GND line 6 in a manner such that the conducting portion 9 (like floating waterweeds) does not contact the main GND line 6.

In the present embodiment, only the portion relating to the main GND line 6 is explained using an enlarged view, but the portion with respect to the main VDD line 5 has a similar structure.

FIG. 3 is a cross-sectional view of the relevant portion, and the figure also shows a transistor. As shown in the figure, an N-channel transistor (i.e., N-ch transistor) 15 is formed on silicon substrate 12 (i.e., semiconductor substrate), which comprises a gate electrode 13, and N$^+$ diffusion layers 14a and 14b functioning as source and drain electrodes. The first AL wiring lines 1 formed on the first inter-layer insulating film 16 are respectively connected to N$^+$ diffusion layers 14a and 14b via the first contacts 17a and 17b. On one of the first AL wiring lines 1 functioning as the GND line 18, (two) first through holes 10, passing through the second inter-layer insulating film 19, are formed. The GND line 18 formed by the first AL wiring line 1 and the main GND line 6 formed by the second AL wiring line 2 are connected via the first conductors 20 in the first through holes 10.

On the other hand, on one of the first AL wiring lines 1 functioning as the signal line 4, (two) first through holes 10 passing through the second inter-layer insulating film 19 are provided. The signal line 4 formed by the first AL wiring line 1 and the conducting portion 9 formed by the second AL wiring line 2 are connected via the first conductors 20 inside the first through holes 10. In addition, (two) second through holes 11 passing through the third inter-layer insulating film 21 are provided on the conducting portion 9. The conducting portion 9 and the bus line 8 formed by the third AL wiring line 3 are connected via the second conductors 22 in the second through holes 11. Therefore, the signal line 4 formed by the first AL wiring line 1 and the bus line 8 formed by the third AL wiring line 3 are electrically connected via the conducting portion 9 without contacting the main GND line 6. Accordingly, this conducting portion 9 functions as a member for connecting the signal line 4 and bus line 8, that is, the conducting portion 9 functions as a "zabuton" (in Japanese, which generally means a cushion)" in the design of a semiconductor device.

As for the above-explained structural elements, material for making the transistor, and the material, thickness, and size of each of the wiring layers and inter-layer insulating films, and the like, are not specifically explained, but known materials, thickness, size, and the like used for the semiconductor processes can be used here.

Below, the method of manufacturing the DRAM/logic mixed LSI having the above-explained structure, in particular, the method of forming the relevant wiring arrangement will be explained with reference to FIGS. 4A and 4B.

Figure 4A:
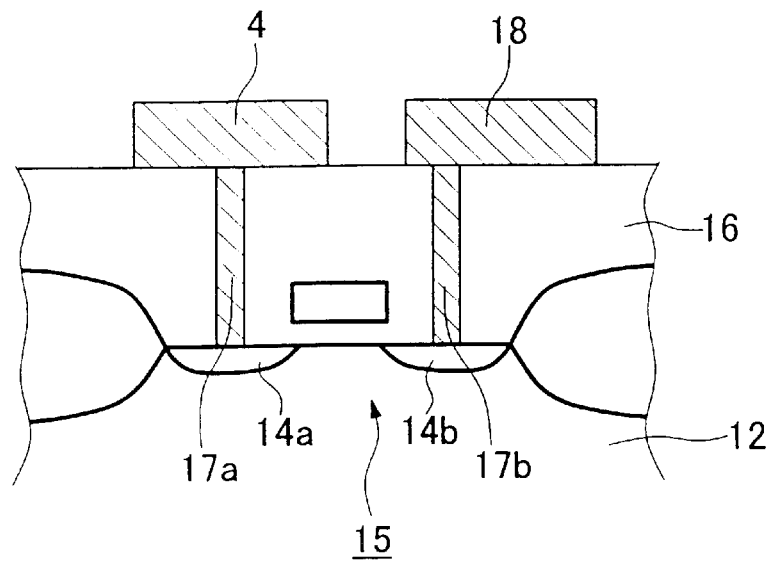
FIGS. 4A and 4B are cross-sectional views for explaining the processes for forming the wiring arrangement of the DRAM/logic mixed LSI.

First, as shown in FIG. 4A, N-ch transistor 15 is formed on silicon substrate 12, and then the first inter-layer insulating film 16 is formed. After that, the first contacts 17a and 17b are formed, which are respectively connected to the N$^+$ diffusion layers 14a and 14b functioning as source/drain electrodes of the N-ch transistor 15. Then, after an AL film is deposited on the first inter-layer insulating film 16, patterning of this AL film is performed, so that the signal line 4 and GND line 18, both formed by the AL wiring line 1, are provided, which are respectively connected to the first contacts 17a and 17b.

Figure 4B:
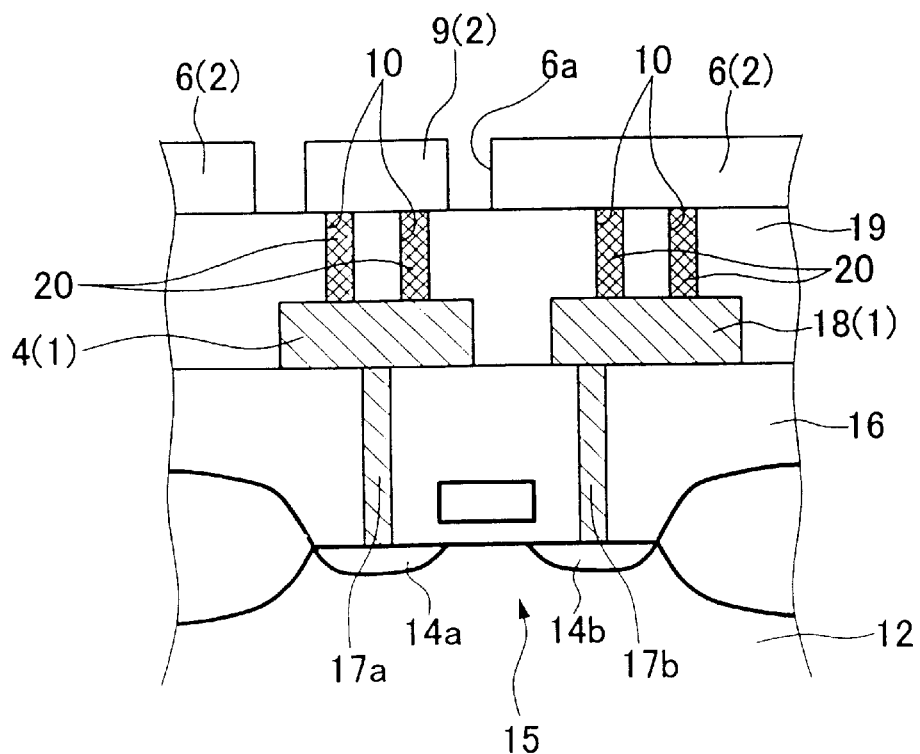
Figure 6:
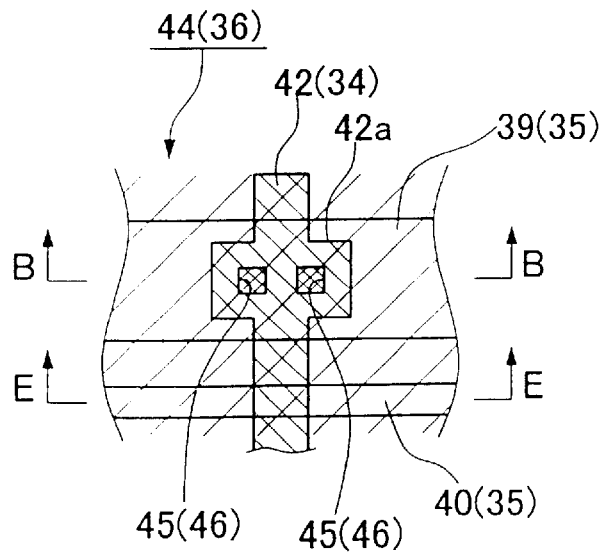
FIG. 6 is an enlarged view of a portion where a GND line connecting arrangement is provided.
Figure 7:
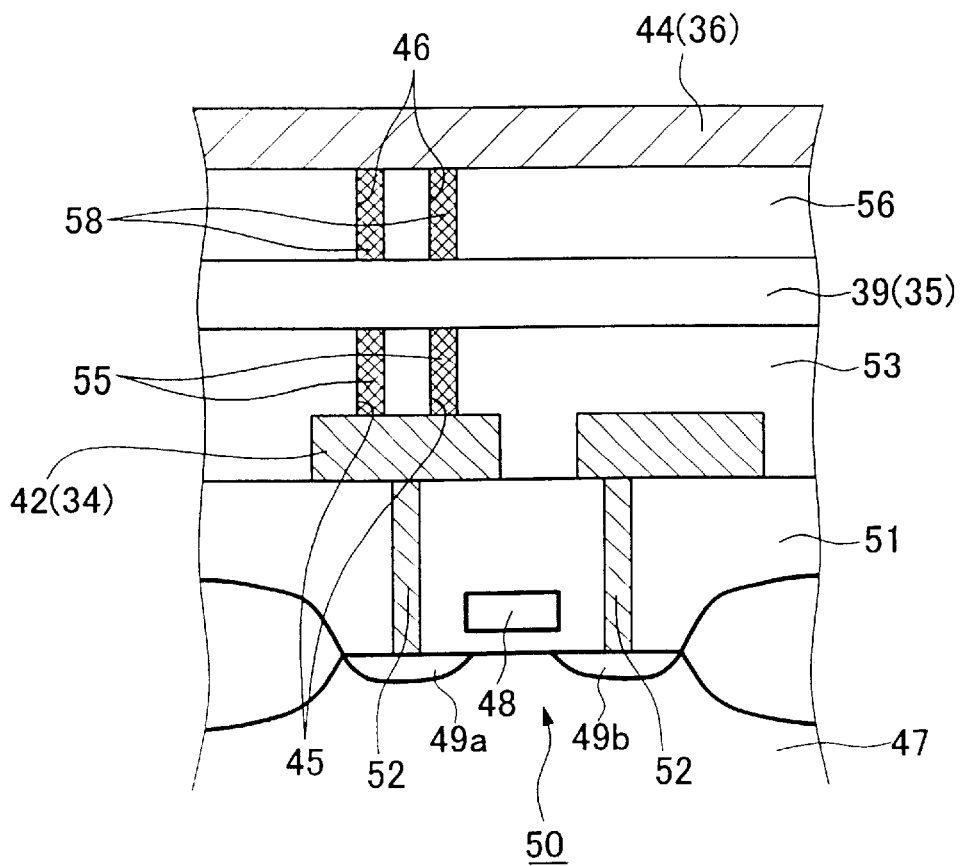
FIG. 7 is a cross-sectional view along line B—B in FIG. 6.
Figure 8:
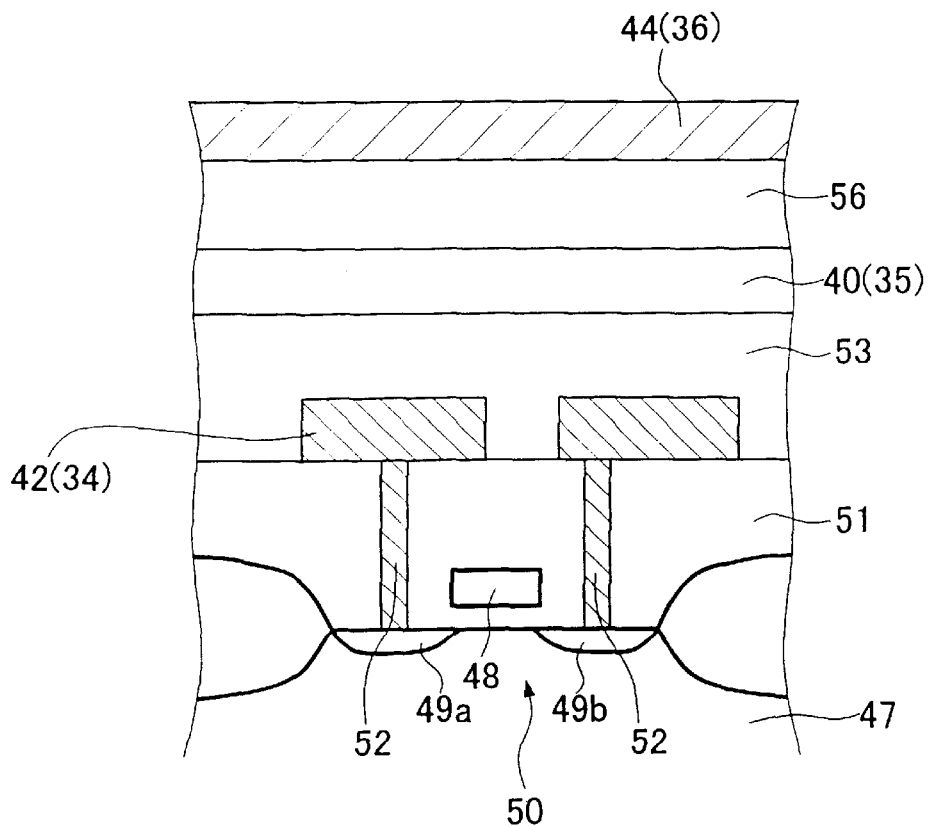
FIG. 8 is a cross-sectional view along line E—E in FIG. 6.

Next, as shown in FIG. 4B, the second inter-layer insulating film 19 with which the signal line 4 and GND line 18 are covered is formed. The first through holes 10, which pass through this second inter-layer insulating film 19 and reach the signal line 4 and GND line 8, are then formed, and the first conductors 20 are embedded in the first through holes 10. After an AL film is deposited on the second inter-layer insulating film 19, and patterning of this AL film is performed, so that the main GND line 6 formed by the second AL wiring line 2 is formed, in which the window 6a is formed by opening a portion corresponding to the position of the first conductors 20, and that conducting portion 9 (like floating waterweeds), isolated from the main GND line 6, is formed on the first conductors 20 inside the window 6a. According to this process, the signal line 4 formed by the first AL wiring line 1 and the conducting portion 9 are connected via the first conductors 20, while the GND line 18 formed by the first AL wiring line 1 and the main GND line 6 are connected via the first conductors 20.

Next, the third inter-layer insulating film 21 is formed, with which the main GND line 6 and conducting portion 9 are covered. Then, after the second through holes 11 which pass through the third inter-layer insulating film 21 and reach the conducting portion 9 are formed, the second conductors 22 are embedded in the second through holes 11. Then, after an AL film is formed on the third inter-layer insulating film 21, patterning of this AL film is performed, so that the bus line 8, formed by the third AL wiring line 3 and connected to the second conductors 22, is provided.

According to the above-explained processes, the signal line 4 formed by the first AL wiring line 1 and the bus line 8 formed by the third AL wiring line 3 are connected via the first conductors 20, the conducting portion 9, and the second conductors 22, so that the wiring structure as shown in FIG. 3 is completed. After these processes, a passivation film or the like is deposited, so that the device is completed.

In the wiring arrangement in the present embodiment, the main GND line 6 having a wider width is formed by the second AL wiring line 2, the bus line 8 is formed by the third AL wiring line 3, and the signal line 4 formed by the first AL wiring line 1 is connected with the bus line 8 formed by the third AL wiring line 3 via conductor 9 which does not contact the main GND line 6. Therefore, no AL wiring line is present above the bus line 8, and capacitance is generated only at the lower side of the bus line. Therefore, the parasitic capacitance of the bus line 8 can be decreased in comparison with the conventional structure, thereby decreasing the signal delay.

Here, though the effect that the parasitic capacitance of the bus line 8 can be generally decreased, it is necessary, in order to adjust the signal timing between the bus lines 8, to adjust the wiring capacitance between the bus lines 8 by using wiring lines for adjusting the capacitance. In the present embodiment, the wiling lines for adjusting the capacitance which function as the AL master slice signal lines and the bus line 8 are formed by the third AL wiring lines 3; therefore, only a mask used for the third AL wiring lines has to be modified, so that the number of masks to be modified can be decreased.

In addition, the third AL wiring lines 3 are provided as the uppermost wiring layer. Therefore, after the target mask is modified according to the results of the characteristic evaluation, the manufacture can be restarted from the patterning process of the third AL wiring lines. In this case, the remaining processes to the completion of the wafer are very few. That is, the necessary processes from the modification of the mask pattern to the completion of the relevant product are fewer, thereby shortening the schedule for developing the device.

Furthermore, in the wiring arrangement according to the present embodiment, the bus line 8 is positioned above the main GND line 6 having a larger width; thus, the main GND line 6 is not an obstacle in this case when the characteristic measurement is performed, that is, the characteristic measurement can be performed by bringing the probe of a tester into direct contact with the exposed bus line 8. In the conventional case in which the main GND line 6 is present above the bus line 8, the process of opening a hole using an FIB or the like is necessary. However, in the present embodiment, such a process is unnecessary; thus, the time and labor necessary for measuring the characteristics of the device can be decreased, so that the characteristic evaluation can be simply and quickly performed. Even though the wiring arrangement of the DRAM area has a three-layered structure as explained above, the wiring arrangement of the logic circuit area may be a four-layered structure and thus the wiring arrangement of the chip may have the four-layered structure. Even in that case, regardless of the logic circuit area, the characteristics of only the DRAM area can be evaluated immediately after the bus line 8 is formed by the third AL wiring line 3.

In the above structure for connecting the signal line 4 and bus line 8, two through holes 10 and two through holes 11 are provided above and below the conducting portion 9. Therefore, even if the contact state of one of the two through holes (at each side) becomes defective, conduction between the signal line 4 and the bus line 8 does not become defective if the other through hole is normal. Therefore, the reliability of wiring and the yield on products can be improved.

The technical fields to which the present invention can be applied are not limited to the above embodiment, but any variations are possible within the scope and spirit of the present invention.

For example, the above embodiment relates to the three-layered wiring arrangement, but the wiring arrangement is not limited to the three-layered structure and a greater number of layers may be provided. In such a case, it is preferable to form three successive layers including, for example, the lower-layer signal line formed by the second layer, the main GND line or main VDD line formed by the third layer, and the upper-layer signal line formed by the fourth layer. However, three non-successive layers may also be used.

In addition, in FIG. 1, a signal line and a bus line are connected at one point on a main GND line. However, a signal line and a plurality of bus lines may be connected at a plurality of points on a main GND line. However, in that case, a larger number of windows must be formed in the main GND line; thus, the effective width of the main GND line becomes smaller and resistance becomes larger.

Therefore, when a plurality of connection points are provided, it is preferable that the windows are not aligned in the width direction of the main GND line, but slightly shifted with respect to each other in the longitudinal direction. In addition, the wiring arrangement of the present invention can be applied to not only the DRAM/logic mixed LSI, but also various kinds of semiconductor devices.

What is claimed is:

1. A semiconductor device comprising:

a lower-layer signal line provided in a lower layer below one of a main power-supply line and a main ground line via an insulating layer; and an upper-layer signal line provided in an upper layer above said one of the main power-supply line and the main ground line via an insulating layer, wherein:

the main power-supply line and the main ground line are wider than the upper-layer signal line;

other lines formed in the upper layer for adjusting the wiring capacity between lines, said other lines functioning as master slice signal lines used for changing a mask pattern of the semiconductor device;

a window formed in said one of the main power-supply line and the main ground line;

the lower-layer signal line and the upper-layer signal line being electrically connected in a space inside the window, without contacting said one of the main power-supply line and the main ground line.

2. A semiconductor device as claimed in claim 1, wherein the upper-layer signal line is formed by the uppermost layer of a multi-layered structure.

3. A semiconductor device as claimed in claim 1, wherein a wiring line for adjusting the wiring capacity of the upper-layer signal line is formed by the same wiring layer as that for forming the upper-layer signal line.

4. A semiconductor device as claimed in claim 1, wherein:

the lower-layer signal line is formed by the nth wiring layer, where n is a natural number of 1 or more;

said one of the main power-supply line and the main ground line is formed by the (n+1)th wiring layer; and the upper-layer signal line is formed by the (n+2)th wiring layer.

5. A semiconductor device as claimed in claim 1, wherein:

a conducting portion is provided in a space inside the window in a manner such that the conducting portion is isolated from said one of the main power-supply line and the main ground line; and the lower-layer signal line and the conducting portion are connected via a through hole, and the conducting portion and the upper-layer signal line are connected via a through hole.

6. A semiconductor device as claimed in claim 5, wherein a plurality of the through holes are provided at either side of the conducting portion.

7. A semiconductor device as claimed in claim 1, wherein the upper-layer signal line is used as a wide area signal line.

* * * * *